(12) United States Patent
Kim et al.

(10) Patent No.: US 10,096,552 B2
(45) Date of Patent: Oct. 9, 2018

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Han Kim, Suwon-si (KR); Eun Jung Jo, Suwon-si (KR); Jung Ho Shim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/689,861

(22) Filed: Aug. 29, 2017

(65) Prior Publication Data
US 2018/0190591 A1 Jul. 5, 2018

(30) Foreign Application Priority Data

Jan. 3, 2017 (KR) .................. 10-2017-0000799
Mar. 22, 2017 (KR) .................. 10-2017-0036054

(51) Int. Cl.
*H01L 25/10* (2006.01)
*H01L 25/065* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ....... H01L 2224/32145; H01L 2224/81; H01L 2224/0239; H01L 23/3107; H01L 23/3114;
(Continued)

(56) References Cited

U.S. PATENT DOCUMENTS 8,203,203 B1   6/2012  Scanlan
9,006,031 B2 * 4/2015  Camacho ............... H01L 24/19
                                                     438/107
(Continued)

FOREIGN PATENT DOCUMENTS

KR    10-2008-0063994 A    7/2008
TW       200931628 A       7/2009
(Continued)

OTHER PUBLICATIONS

Taiwanese Office Action issued in corresponding Taiwanese Patent Application No. 106129419, dated Apr. 27, 2018, with English Translation.

*Primary Examiner* — Jasmine Clark
(74) *Attorney, Agent, or Firm* — McDermott Will & Emery LLP

(57) ABSTRACT

A fan-out semiconductor package includes: a first semiconductor chip; a first encapsulant; a connection member including first vias and a first redistribution layer; a second semiconductor chip; a second encapsulant; a second redistribution layer; second vias; and third vias. A length of the longest side of a first cut surface of the second via is less than that of the longest side of a second cut surface of the third via, the first cut surface of the second via and the second cut surface of the third via being cut by a plane on any level parallel to the second active surface.

20 Claims, 22 Drawing Sheets

(51) Int. Cl.
*H01L 23/28* (2006.01)
*H01L 23/48* (2006.01)
*H01L 23/538* (2006.01)
*H01L 23/31* (2006.01)
*H01L 23/00* (2006.01)
*H01L 21/48* (2006.01)

(52) U.S. Cl.
CPC ...... *H01L 23/3114* (2013.01); *H01L 23/5383* (2013.01); *H01L 23/5386* (2013.01); *H01L 23/562* (2013.01); *H01L 24/19* (2013.01); *H01L 24/20* (2013.01); *H01L 2224/19* (2013.01); *H01L 2224/214* (2013.01)

(58) Field of Classification Search
CPC . H01L 23/5383; H01L 23/5386; H01L 24/19; H01L 24/20; H01L 21/565; H01L 2224/214; H01L 25/0657; H01L 2225/06548; H01L 25/105; H01L 2225/1035; H01L 2225/1041; H01L 23/5389
See application file for complete search history.

(56) References Cited

U.S. PATENT DOCUMENTS

| | | |
|---|---|---|
| 2009/0127686 A1 | 5/2009 | Yang et al. |
| 2013/0105991 A1* | 5/2013 | Gan .................. H01L 25/105 257/777 |
| 2013/0270670 A1 | 10/2013 | Yang et al. |
| 2014/0264733 A1 | 9/2014 | Yuan et al. |
| 2016/0307872 A1 | 10/2016 | Chen et al. |
| 2016/0329262 A1 | 11/2016 | Hsiao et al. |

FOREIGN PATENT DOCUMENTS

| | | |
|---|---|---|
| TW | 201347130 A | 11/2013 |
| TW | 201436162 A | 9/2014 |
| TW | 201639093 A | 11/2016 |
| TW | 201640628 A | 11/2016 |

* cited by examiner

FAN-OUT SEMICONDUCTOR PACKAGE

CROSS-REFERENCE TO RELATED APPLICATION(S)

This application claims benefit of priority to Korean Patent Application Nos. 10-2017-0000799 filed on Jan. 3, 2017 and 10-2017-0036054 filed on Mar. 22, 2017 in the Korean Intellectual Property Office, the disclosures of which are incorporated herein by reference in its entirety.

TECHNICAL FIELD

The present disclosure relates to a semiconductor package, and more particularly, to a fan-out semiconductor package in which connection terminals may extend outwardly of a region in which a semiconductor chip is disposed.

BACKGROUND

Recently, a significant recent trend in the development of technology related to semiconductor chips has been to reduce the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of package technology suggested to satisfy the technical demand as described above is a fan-out semiconductor package. Such a fan-out semiconductor package has a compact size and may allow a plurality of pins to be implemented by redistributing connection terminals outwardly of a region in which a semiconductor chip is disposed.

SUMMARY

An aspect of the present disclosure may provide a fan-out semiconductor package capable of being thinned and having improved performance and excellent reliability in spite of using a plurality of semiconductor chips.

According to an aspect of the present disclosure, a fan-out semiconductor package may be provided, in which a plurality of semiconductor chips are stacked and packaged, and are disposed in a special form to be thus electrically connected to a redistribution layer of a connection member through vias rather than wires.

According to an aspect of the present disclosure, a fan-out semiconductor package may include: a first semiconductor chip having a first active surface having first connection pads disposed thereon and a first inactive surface opposing the first active surface; a first encapsulant encapsulating at least portions of the first semiconductor chip; a connection member disposed on the first encapsulant and the first active surface of the first semiconductor chip and including first vias and a first redistribution layer electrically connected to the first connection pads through the first vias; a second semiconductor chip having a second active surface having second connection pads disposed thereon and a second inactive surface opposing the second active surface and attached to the connection member; a second encapsulant covering at least portions of the connection member and encapsulating at least portions of the second semiconductor chip; a second redistribution layer disposed on the second encapsulant and the second active surface of the second semiconductor chip; second vias penetrating through the second encapsulant and electrically connecting the second connection pads and the second redistribution layer to each other; and third vias penetrating through the second encapsulant and electrically connecting the first redistribution layer and the second redistribution layer to each other. A length of the longest side of a first cut surface of the second via is less than that of the longest side of a second cut surface of the third via, the first cut surface of the second via and the second cut surface of the third via being cut by a plane on any level parallel to the second active surface.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
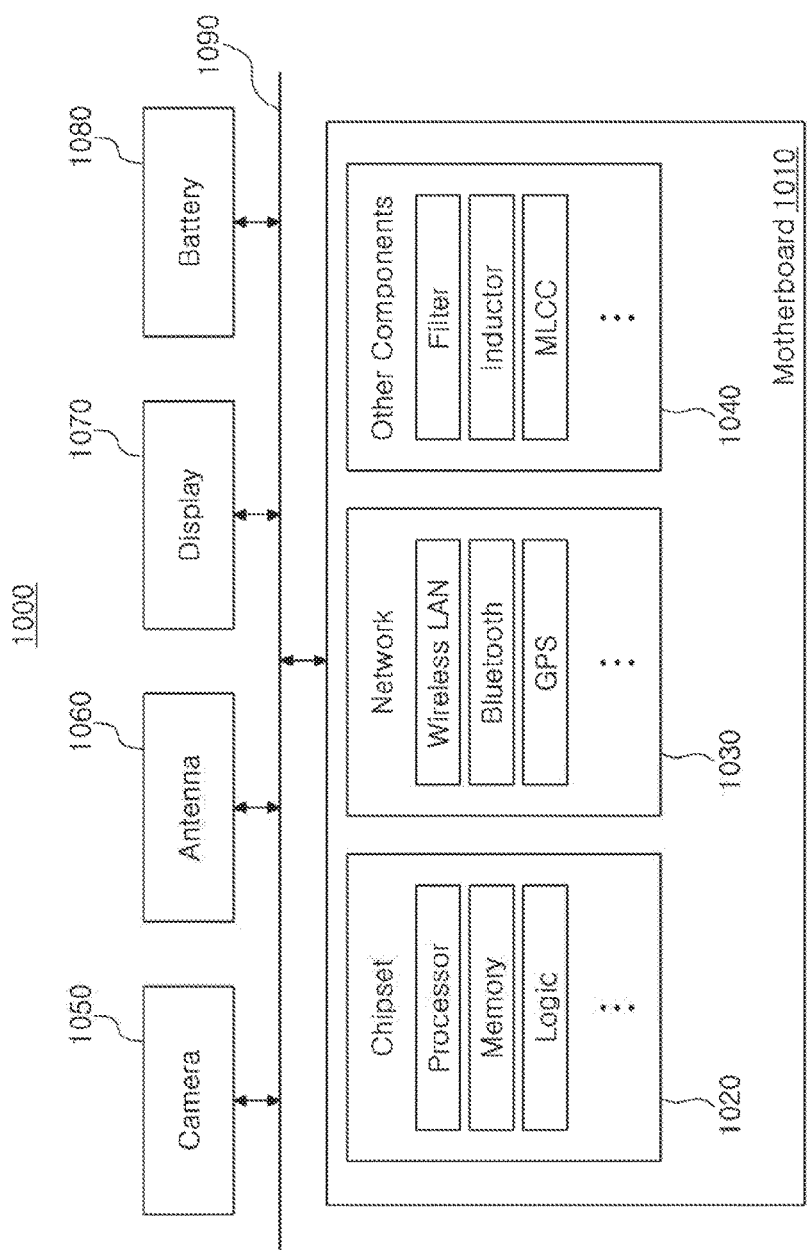
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the attached drawings. For example, a connection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a motherboard 1010 therein. The motherboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the motherboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
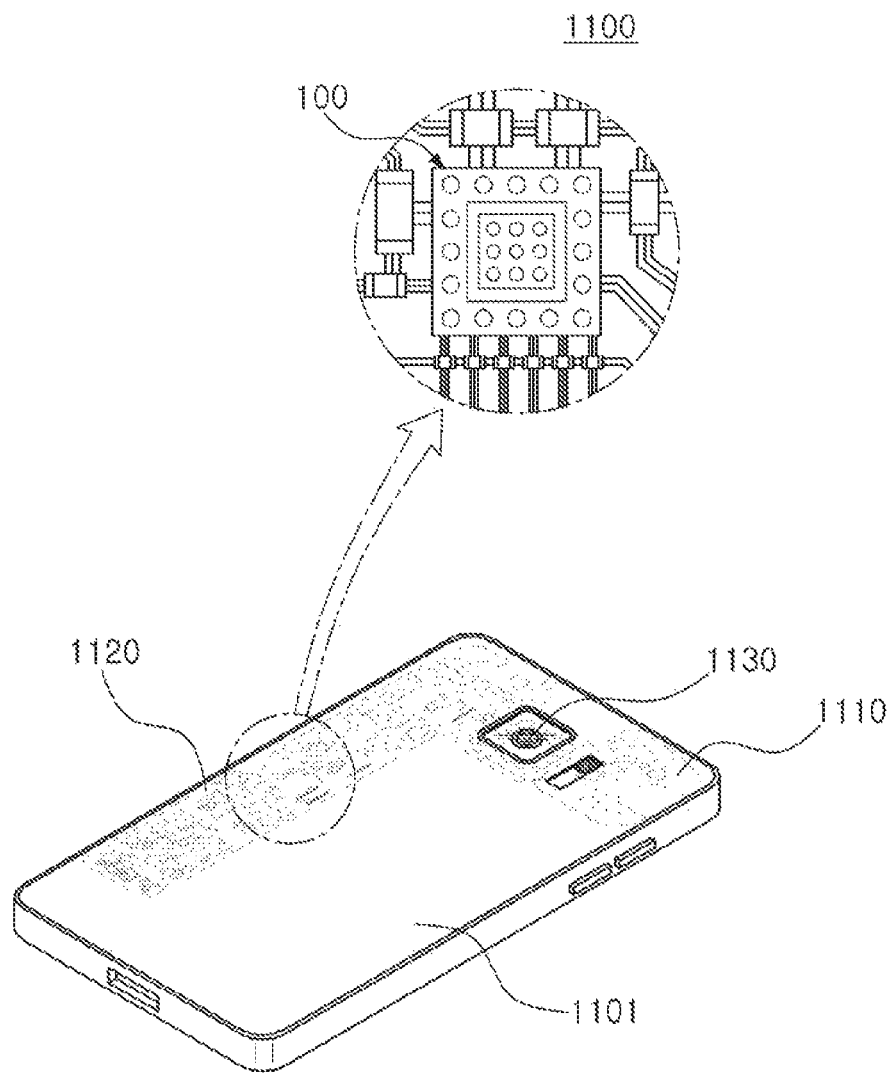
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3:
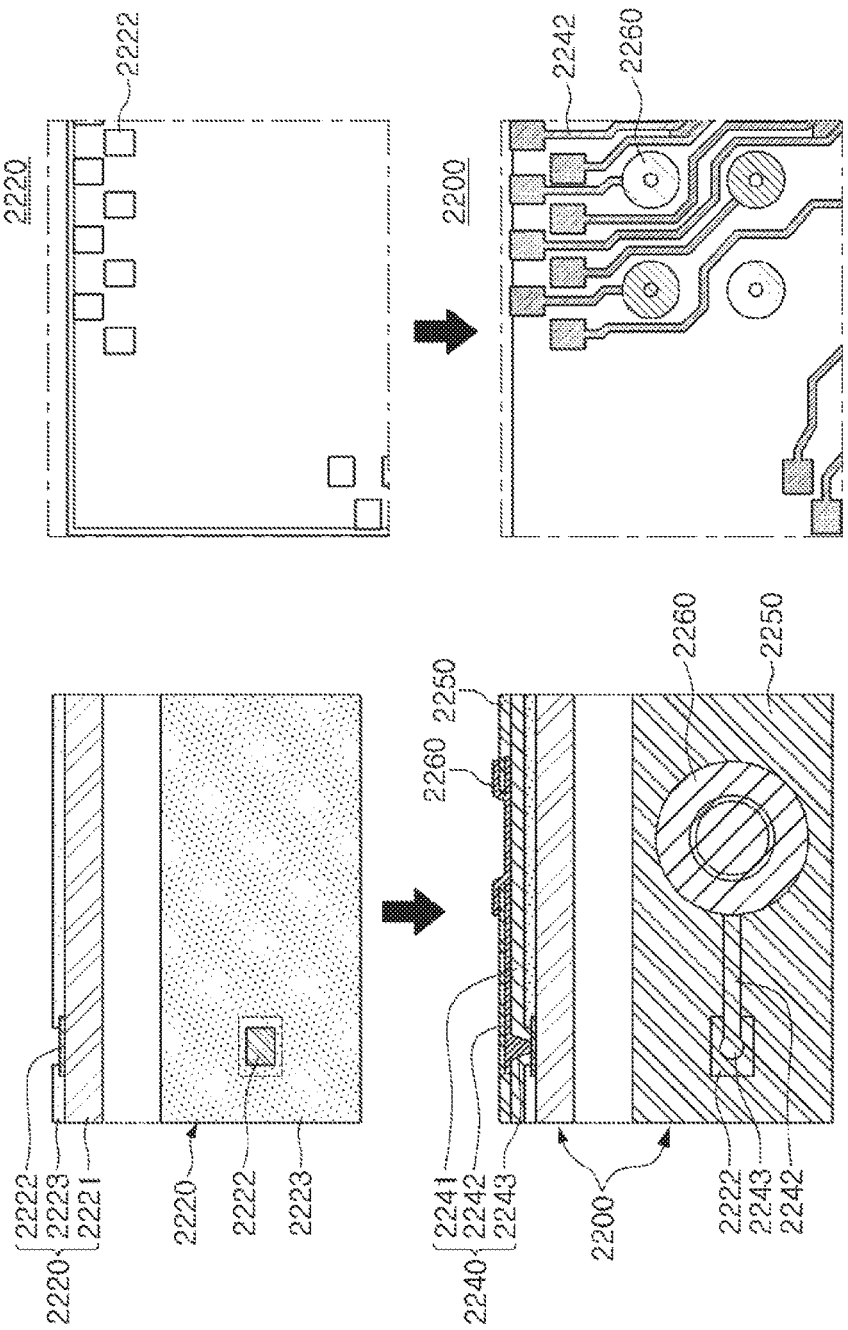
FIGS. 3A and 3B are schematic cross-sectional views illustrating states of a fan-in semiconductor package before and after being packaged.

FIGS. 3A and 3B are schematic cross-sectional views illustrating states of a fan-in semiconductor package before and after being packaged.

Figure 4:
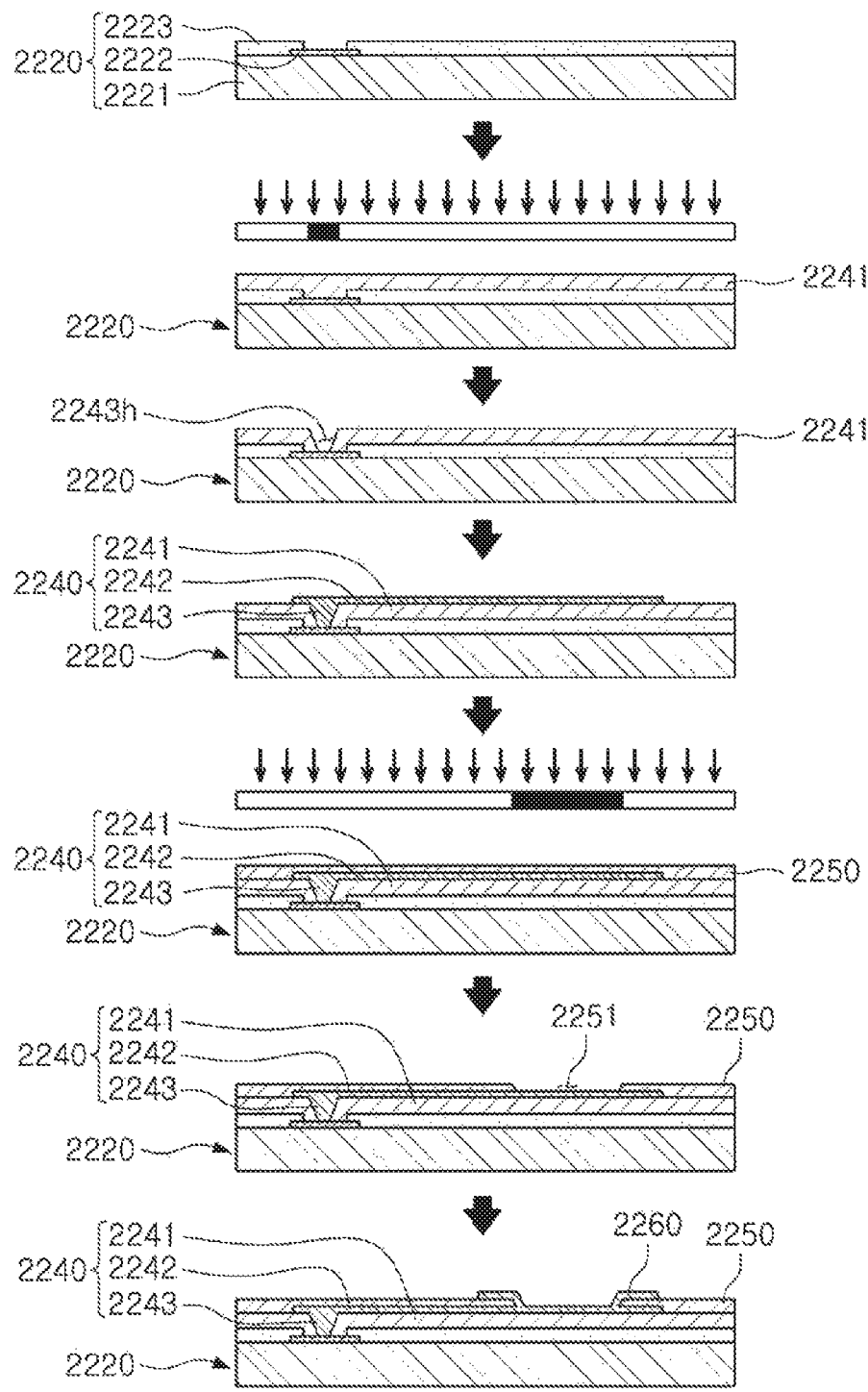
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. Here, even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
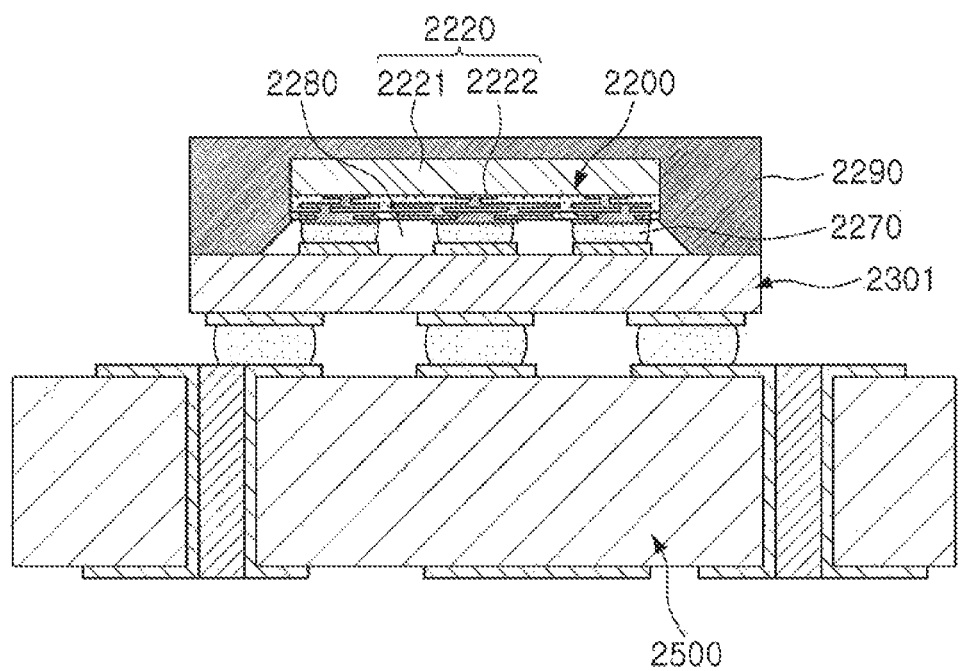
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
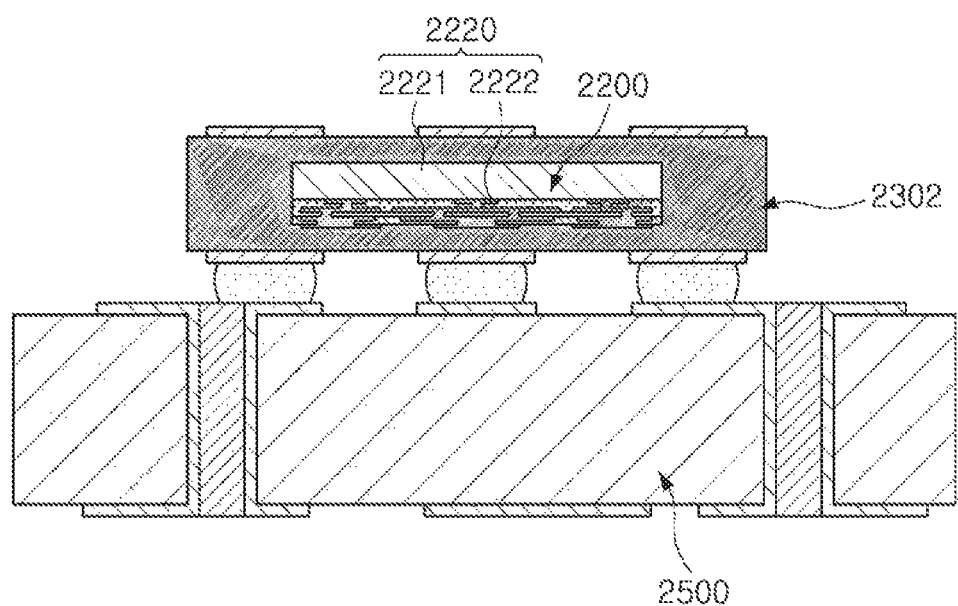
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an external surface of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
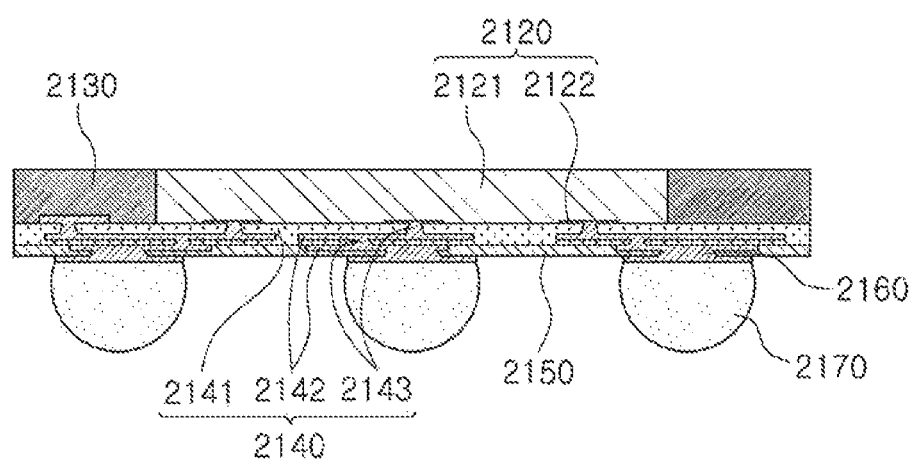
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
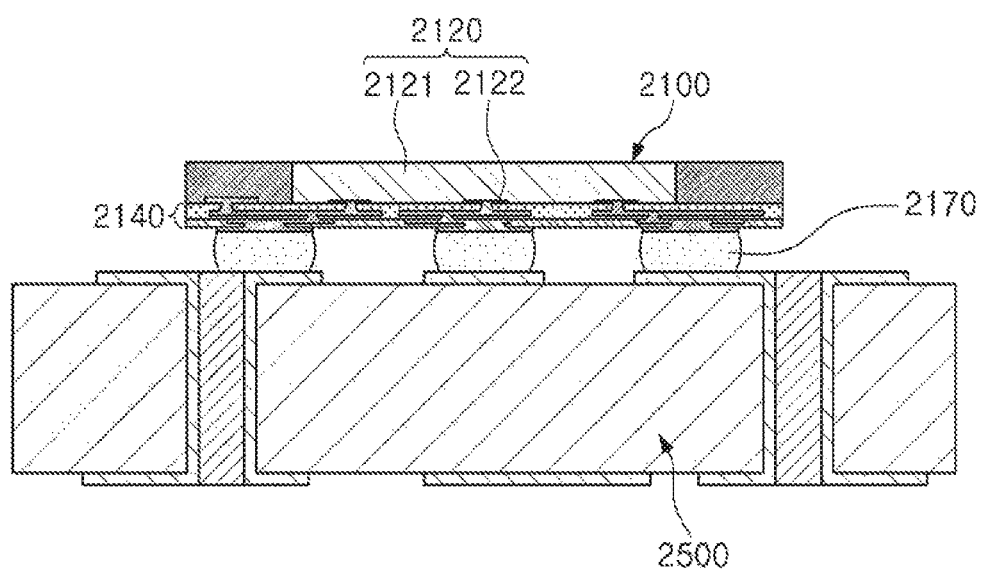
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package capable of being thinned and having improved performance and excellent reliability in spite of using a plurality of semiconductor chips will hereinafter be described with reference to the drawings.

Figure 9:
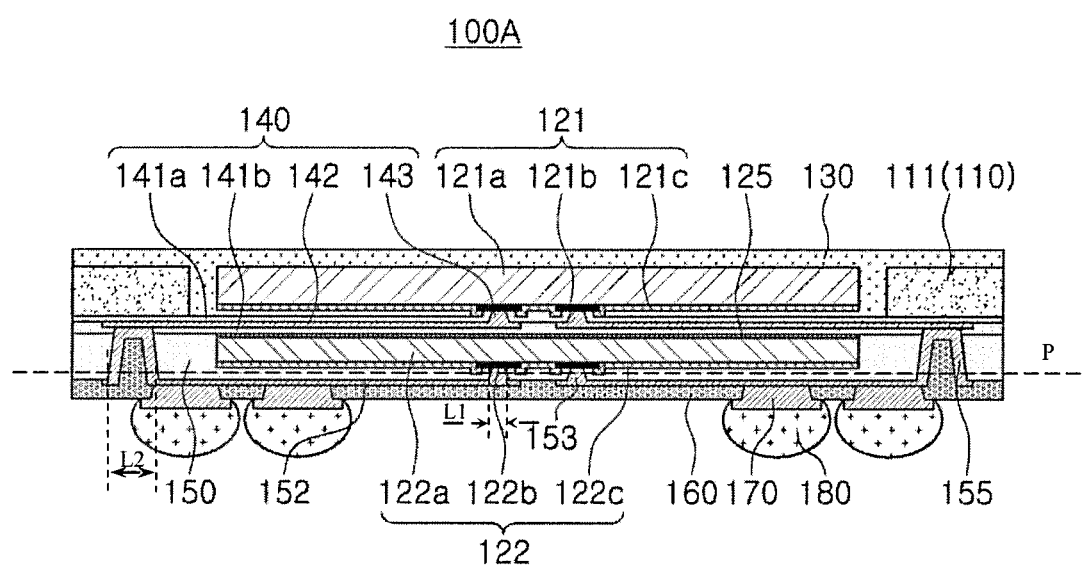
FIG. 9 is a schematic cross-sectional view illustrating an example of a fan-out semiconductor package.

FIG. 9 is a schematic cross-sectional view illustrating an example of a fan-out semiconductor package.

Figure 10A:
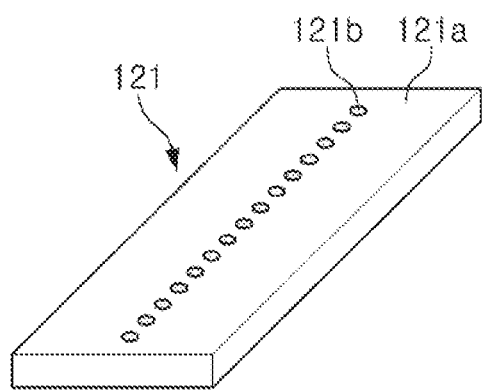
FIGS. 10A and 10B are schematic views illustrating various arrays of first connection pads disposed on an active surface of a first semiconductor chip of the fan-out semiconductor package of FIG. 9.
Figure 10B:
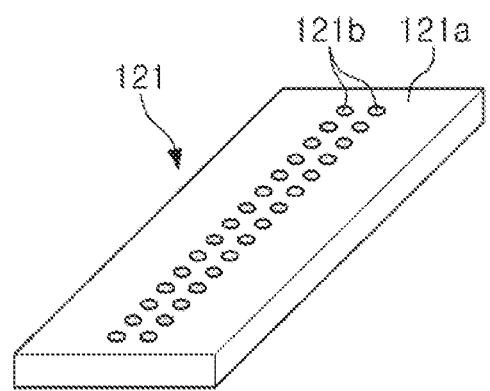

FIGS. 10A and 10B are schematic views illustrating various arrays of first connection pads disposed on an active surface of a first semiconductor chip of the fan-out semiconductor package of FIG. 9.

Referring to the drawings, a fan-out semiconductor package 100A according to an exemplary embodiment in the present disclosure may include a first semiconductor chip 121 having an active surface having first connection pads 121*b* disposed thereon and an inactive surface opposing the active surface, a first encapsulant 130 encapsulating at least portions of the first semiconductor chip 121, a connection member 140 disposed on the active surface of the first semiconductor chip 121 and including first vias 143 and a first redistribution layer 142 electrically connected to the first connection pads 121*b* through the first vias 143, a second semiconductor chip 122 attached to the other surface of the connection member 140 opposing one surface of the connection member 140 on which the first semiconductor chip 121 is disposed and having an active surface having second connection pads 122*b* disposed thereon and an inactive surface opposing the active surface, a second encapsulant 150 disposed on the other surface of the connection member 140 opposing one surface of the connection member 140 on which the first semiconductor chip 121 is disposed and encapsulating at least portions of the active surface of the second semiconductor chip 122, a second redistribution layer 152 disposed on the second encapsulant 150 and the active surface of the second semiconductor chip 122, second vias 153 penetrating through the second encapsulant 150 and electrically connecting the second connection pads 122b and the second redistribution layer 152 to each other, and third vias 155 penetrating through the second encapsulant 150 and electrically connecting the first redistribution layer 142 and the second redistribution layer 152 to each other. Here, when the second via 153 and the third via 153 are formed in the same level in a surface parallel with the active surface of the second semiconductor chip, a length of a long side of a cut surface of the third via 155 may be greater than that of a long side of a cut surface of the second via 153 on any level. Here, the length of the long side means the longest distance of distances between two points at which any straight lines passing through the center of the cut surface meet an outer edge of the cut surface, respectively, in each horizontal cut surface. For example, a length L1 of the longest side of a first cut surface of the second via 153 is less than a length L2 of the longest side of a second cut surface of the third via 155, the first cut surface of the second via 153 and the second cut surface of the third 155 via being cut by a plane P on any level parallel to the second active surface.

Figure 19:
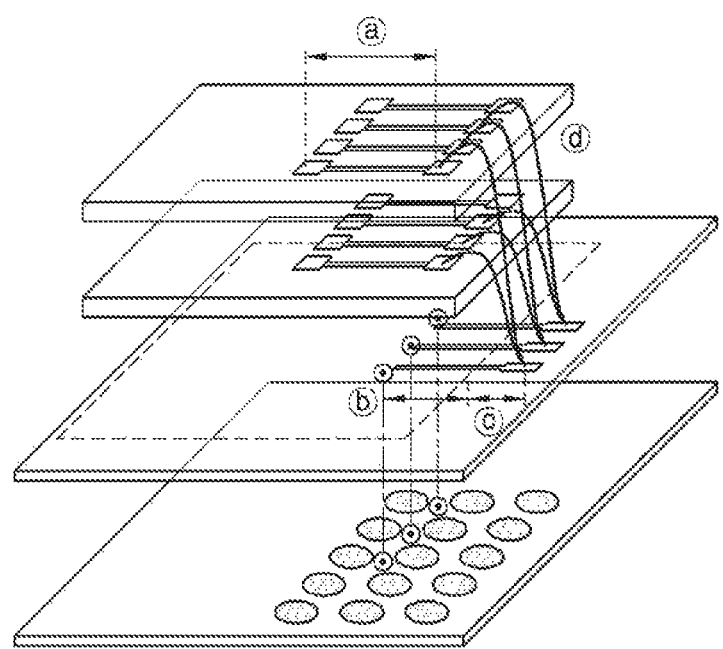
FIG. 19 is a schematic view illustrating a problem of a fan-out semiconductor package according to the related art.

Meanwhile, recently, technology of stacking a plurality of memory chips in multiple stages in order to increase a capacity of a memory has been developed. For example, as illustrated in FIG. 19, there may be technology of stacking a plurality of memory chips in two stages (or three stages), mounting the stacked memory chips on an interposer substrate, and then molding the stacked memory chips mounted on the interposer substrate using a molding material to be thus used in a package form. In this case, the stacked memory chips are electrically connected to the interposer substrate by wire bonding. However, in this structure, there is a limitation in thinness due to a significant thickness of the interposer substrate. In addition, when the interposer substrate is manufactured on the basis of silicon, significant costs are required. In addition, when a reinforcing material holding the stacked memory chips is not separately included, a problem may occur in reliability due to warpage. Particularly, since the stacked memory chips are electrically connected to the interposer substrate by the wire bonding, such that inputs and outputs are redistributed, signal paths ⓐ, ⓑ, ⓒ, and ⓓ are significantly long, such that signal loss may be frequently generated.

Figure 18A:
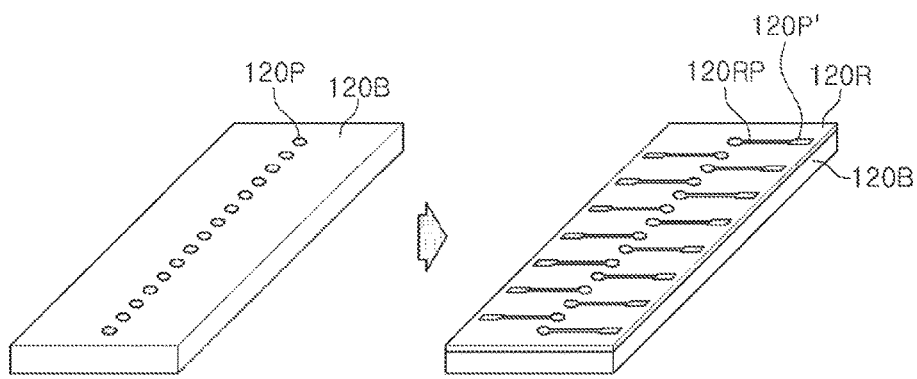
FIGS. 18A and 18B are schematic views illustrating a process of redistributing a semiconductor chip in a bare state according to the related art.
Figure 18B:
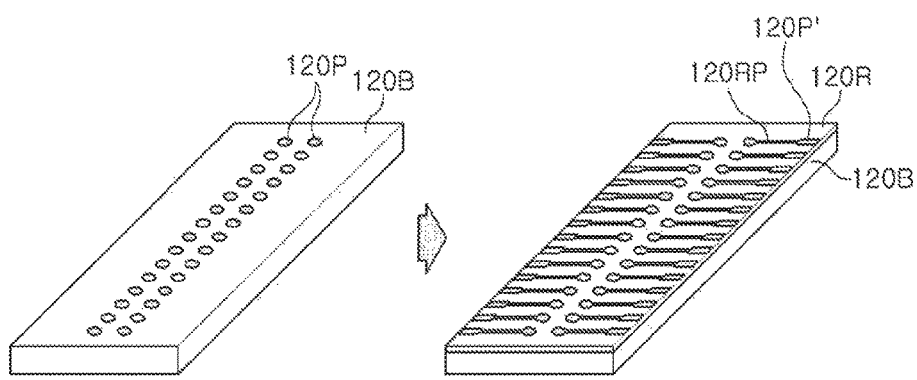

Particularly, in such a wire bonding manner, connection pads disposed on a central portion of an active surface of a semiconductor chip need to be intentionally redistributed outwardly of the active surface of the semiconductor chip by forming a redistribution layer in order to stack the semiconductor chip. For example, as illustrated in FIG. 18A, connection pads 120P disposed in one row on a central portion of an active surface of a semiconductor chip 120B in a bare state may be redistributed outwardly of the active surface of the semiconductor chip 120B by redistribution patterns 120RP of a redistribution layer 120R. Alternatively, as illustrated in FIG. 18B, connection pads 120P disposed in two rows on a central portion of an active surface of a semiconductor chip 120B in a bare state may be redistributed outwardly of the active surface of the semiconductor chip 120B by redistribution patterns 120RP of a redistribution layer 120R. In any case, redistributed connection pads 120P' may be positioned on both sides of the active surface of the semiconductor chip 120B. In this case, there is a limitation in an efficient design and disposition of the semiconductor chip 120B. For example, signal loss may be generated due to an increase in signal paths, or the like. In addition, a separate redistribution layer forming process needs to be added, and productivity may thus be reduced.

Figure 17:
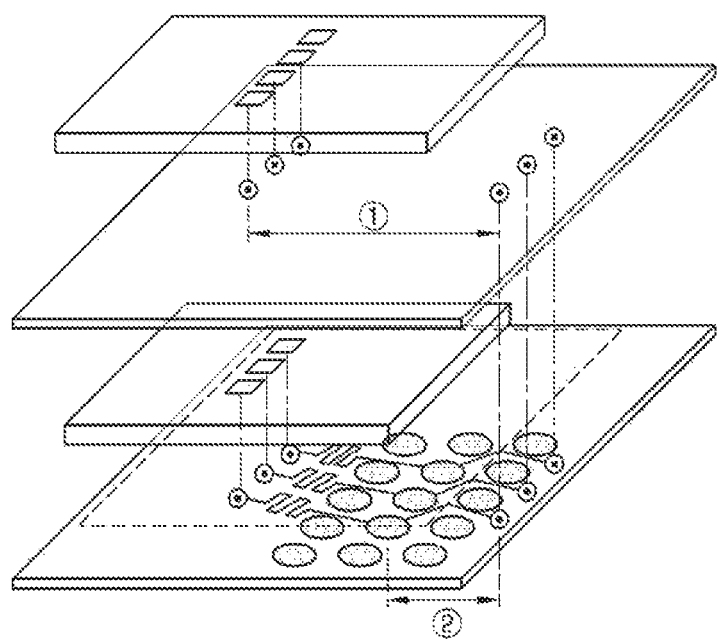
FIG. 17 is a schematic view illustrating an effect of a fan-out semiconductor package according to an exemplary embodiment in the present disclosure.

On the other hand, in the fan-out semiconductor package 100A according to the exemplary embodiment, as illustrated in FIG. 17, signal paths ① and ② may be formed through vias rather than wiring bonding to be thus significantly reduced. Resultantly, generation of signal loss may also be significantly reduced. That is, signal electrical characteristics may be improved. Particularly, the third vias 155 connecting the redistribution layers 142 and 152 formed on different layers to each other may be formed to have a diameter greater than those of the first vias 143 and the second vias 153, resulting in improvement of reliability such as stable transmission of a high-current signal, or the like. In addition, as illustrated in FIGS. 10A and 10B, the first semiconductor chip 121 disposed on the connection member as well as the second semiconductor chip 122 disposed beneath the connection member may be packaged in a bare state. That is, the first and second connection pads 121b and 122b of the first and second semiconductor chips 121 and 122 may be disposed on central portions of the active surfaces of the first and second semiconductor chips 121 and 122, respectively. Here, each of the first connection pads 121b may be arrayed in one row as illustrated in FIG. 10A or be arrayed in two rows as illustrated in FIG. 10B. Although not shown in the drawings, the second connection pads 122b of the second semiconductor chip may be configured to have a similar manner as that of the first connection pads 121b of the first semiconductor chip. For example, the second connection pads 121b may be arrayed in one row similar to a configuration of the first connection pads 121b as illustrated in FIG. 10A, or be arrayed in two rows similar to a configuration of the first connection pads 121b as illustrated in FIG. 10B. Here, the first semiconductor chip 121 may be connected to the first redistribution layer 142 of the connection member 140 through the first vias 143 and the first redistribution layer 142 may be connected to the second redistribution layer 152 formed on the second encapsulant 150 through the third vias 155 penetrating through the second encapsulant 150. As described above, formation of redistribution layers in a chip state for redesigning the connection pads 121b and 122b of the semiconductor chips 121 and 122 is not required, and the connection pads 121b and 122b positioned at the centers of the semiconductor chips 121 and 122 for the purpose of the most efficient designs of the semiconductor chips 121 and 122 may be used in the fan-out semiconductor package 100A as they are without a separate change operation.

In addition, in the fan-out semiconductor package 100A according to the exemplary embodiment, the connection member 140 including the first redistribution layer 142, the second redistribution layer 152 disposed on the second encapsulant 150, or the like, may be formed, instead of an interposer substrate. Therefore, as illustrated in FIG. 17, the redistribution layers 142 and 152 may be distributed to various positions, such that a thickness of the connection member 140 may be significantly reduced, and a backside encapsulation thickness or a thickness of the stacked chips may also be significantly reduced. In addition, the inactive surface of the second semiconductor chip 122 may be attached to the connection member 140 using an adhesive member 125 such as a die attach film (DAF), or the like, and the attached second semiconductor chip 122 may be encapsulated with the second encapsulant 150 to be thus effectively fixed, such that reliability may be improved.

Meanwhile, the fan-out semiconductor package 100A according to the exemplary embodiment may include a support member 110, and the first semiconductor chip 121 may be disposed in a through-hole 110H of the support member 110. In this case, warpage may be controlled through the support member 110, and reliability may thus be improved. In addition, the fan-out semiconductor package 100A may further include a passivation layer 160 disposed on the second encapsulant 150, an underbump metal layer 170 formed in openings of the passivation layer 160, and connection terminals 180 formed on the underbump metal layer 170.

The respective components included in the fan-out semiconductor package 100A according to the exemplary embodiment will hereinafter be described in more detail.

The first semiconductor chip 121 may be an integrated circuit (IC) provided in an amount of several hundreds to several millions of elements or more integrated in a single chip. The IC may be a volatile memory (such as a DRAM), a non-volatile memory (such as a ROM), a flash memory, or the like, but is not limited thereto. The active surface of the first semiconductor chip 121 refers to a surface of the first semiconductor chip 121 on which the first connection pads 121b are disposed, and the inactive surface thereof refers to a surface opposing the active surface. The first semiconductor chip 121 may be formed on the basis of an active wafer. In this case, a base material of a body 121a may be silicon (Si), germanium (Ge), gallium arsenide (GaAs), or the like. Various circuits may be formed on the body 121a. The first connection pads 121b may electrically connect the first semiconductor chip 121 to other components, and a conductive material such as aluminum (Al), or the like, may be used as a material of each of the first connection pads 121b. A passivation layer 121c exposing the first connection pads 121b may be formed on the body 121a, if necessary, and may be an oxide film, a nitride film, or the like, or a double layer of an oxide layer and a nitride layer. Other insulating layer (not illustrated), and the like, may also be disposed.

The first encapsulant 130 may protect the first semiconductor chip 121. An encapsulation form of the first encapsulant 130 is not particularly limited, but may be a form in which the first encapsulant 130 surrounds at least portions of the first semiconductor chip 121. For example, the first encapsulant 130 may cover at least portions of the support member 110 and the inactive surface of the first semiconductor chip 121, and fill at least portions of spaces between walls of the through-hole 110H and side surfaces of the first semiconductor chip 121. Meanwhile, the first encapsulant 130 may fill the through-hole 110H to thus serve as an adhesive for fixing the first semiconductor chip 121 and reduce buckling of the first semiconductor chip 121 depending on certain materials. The first encapsulant 130 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, or the like. In addition, the known molding material such as an epoxy molding compound (EMC), or the like, may also be used. Alternatively, a material in which a thermosetting resin or a thermoplastic resin is impregnated in an inorganic filler and/or a core material such as a glass fiber (or a glass cloth or a glass fabric) may also be used as the insulating material.

The connection member 140 may redistribute the first connection pads 121b of the first semiconductor chip 121. Several tens to several hundreds of first connection pads 121b having various functions may be redistributed by the connection member 140, and may be physically or electrically connected to other components through third vias 155 to be described below depending on the functions. The connection member 140 may include a first insulating layer 141a, the first redistribution layer 142 disposed on the first insulating layer 141a, the first vias 143 penetrating through the first insulating layer 141a and connecting the first connection pads 121b to the first redistribution layer 142, and a second insulating layer 141b disposed on the first insulating layer 141a and covering at least portions of the first redistribution layer 142. Meanwhile, the numbers of insulating layers 141a and 141b, redistribution layers 142, vias 143, and the like, constituting the connection member 140 may be more than those described above.

An insulating material may be used as a material of each of the insulating layers 141a and 141b. In this case, a photosensitive insulating material such as a photoimagable dielectric (PID) resin may also be used as the insulating material. That is, the insulating layers 141a and 141b may be photosensitive insulating layers. When the insulating layers 141a and 141b has photosensitive properties, the insulating layers 141a and 141b may be formed to have a smaller thickness, and a fine pitch of the first vias 143 may be achieved more easily. The insulating layers 141a and 141b may be photosensitive insulating layers including an insulating resin and an inorganic filler. When the insulating layers 141a and 141b are multiple layers, the materials of the insulating layers 141a and 141b may be the same as each other, and may also be different from each other, if necessary. When the insulating layers 141a and 141b are the multiple layers, the insulating layers 141a and 141b may be integrated with each other depending on a process, such that a boundary therebetween may also not be apparent.

The first redistribution layer 142 may serve to redistribute the first connection pads 121b to other regions. A material of the first redistribution layer 142 may be a conductive material such as copper (Cu), aluminum (Al), silver (Ag), tin (Sn), gold (Au), nickel (Ni), lead (Pb), titanium (Ti), or alloys thereof. The first redistribution layer 142 may perform various functions depending on a design of the corresponding layer. For example, the first redistribution layer 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first redistribution layer 142 may include various pad patterns such as via pads, connection terminal pads, and the like. When the fan-out semiconductor package is projected in a direction perpendicular to the active surface of the first semiconductor chip 121, if a projected region of the first semiconductor chip 121 is a first region and a region surrounding the first region is a second region, all the first connection pads 121b connected to the first vias 143 may be redistributed to the second region through the first redistribution layer 142. That is, all the first connection pads 121b connected to the first vias 143 of the first semiconductor chip 121 may be redistributed to a fan-out region.

The first vias 143 may electrically connect the first redistribution layers 142, the first connection pads 121b, and the like, formed on different layers to each other, resulting in an electrical path. A material of each of the first vias 143 may be a conductive material such as copper (Cu), aluminum (Al), silver (Ag), tin (Sn), gold (Au), nickel (Ni), lead (Pb), titanium (Ti), or alloys thereof. Each of the first vias 143 may be completely filled with the conductive material, or the conductive material may also be formed along a wall of each of via holes. In addition, each of the first vias 143 may have all of the shapes known in the related art, such as a tapered shape, a cylindrical shape, and the like.

The support member 110 may maintain rigidity of the fan-out semiconductor package 100A depending on certain materials, and serve to secure uniformity of a thickness of the first encapsulant 130. In addition, due to the support member 110, the fan-out semiconductor package 100A according to the exemplary embodiment may be used as a portion of a package-on-package. The support member 110 may have the through-hole 110H. The first semiconductor chip 121 may be disposed in the through-hole 110H to be spaced apart from the support member 110 by a predetermined distance. The side surfaces of the first semiconductor chip 121 may be surrounded by the support member 110. However, such a form is only an example and may be variously modified to have other forms, and the support member 110 may perform another function depending on such a form. In some cases, the support member 110 may also be omitted.

A material of an insulating layer 111 constituting the supporting member 110 is not particularly limited. For example, an insulating material may be used as the material of the insulating layer. In this case, the insulating material may be a thermosetting resin such as an epoxy resin, a thermoplastic resin such as a polyimide resin, an insulating material in which the thermosetting resin or the thermoplastic resin is impregnated in an inorganic filler or a core material such as a glass fiber (or a glass cloth or a glass fabric), for example, prepreg, Ajinomoto Build up Film (ABF), FR-4, Bismaleimide Triazine (BT), or the like. Alternatively, a PID resin may also be used as the insulating material.

The second semiconductor chip 122 may also be an integrated circuit (IC) provided in an amount of several hundreds to several millions of elements or more integrated in a single chip. The IC may be a volatile memory (such as a DRAM), a non-volatile memory (such as a ROM), a flash memory, or the like, but is not limited thereto. The active surface of the second semiconductor chip 122 refers to a surface of the second semiconductor chip 122 on which the second connection pads 122b are disposed, and the inactive surface thereof refers to a surface opposing the active surface. The second semiconductor chip 122 may be formed on the basis of an active wafer. In this case, a base material of a body 122a may be silicon (Si), germanium (Ge), gallium arsenide (GaAs), or the like. Various circuits may be formed on the body 122a. The second connection pads 122b may electrically connect the second semiconductor chip 122 to other components, and a conductive material such as aluminum (Al), or the like, may be used as a material of each of the second connection pads 122b. A passivation layer 122c exposing the second connection pads 122b may be formed on the body 122a, if necessary, and may be an oxide film, a nitride film, or the like, or a double layer of an oxide layer and a nitride layer. Other insulating layer (not illustrated), and the like, may also be disposed.

The adhesive member 125 may easily attach the inactive surface of the second semiconductor chip 122 to the second insulating layer 141b of the connection member 140. The adhesive member 125 may be the known tape such as the die attach film (DAF). A material of the adhesive member 125 is not particularly limited. The adhesive member 125 may include, for example, an epoxy component, but is not limited thereto. The second semiconductor chip 122 may be more stably mounted through the adhesive member 125, and reliability may thus be improved.

The second encapsulant 150 may protect the second semiconductor chip 122. An encapsulation form of the second encapsulant 150 is not particularly limited, but may be a form in which the second encapsulant 150 surrounds at least portions of the second semiconductor chip 122. For example, the second encapsulant 150 may cover at least portions of the active surface of the second semiconductor chip 122, and also cover at least portions of side surfaces of the second semiconductor chip 122. The second encapsulant 150 may include an insulating material. A PID, or the like, may be used as the insulating material. However, the insulating material is not limited thereto. That is, a material including an inorganic filler and an insulating resin, for example, a thermosetting resin such as an epoxy resin, a thermoplastic resin such as a polyimide resin, or a resin having a reinforcing material such as an inorganic filler impregnated in the thermosetting resin and the thermoplastic resin, more specifically, an ABF, or the like, may be used as the insulating material. In addition, the known molding material such as an epoxy molding compound (EMC), or the like, may also be used. Alternatively, a material in which a thermosetting resin or a thermoplastic resin is impregnated in an inorganic filler and/or a core material such as a glass fiber (or a glass cloth or a glass fabric) may also be used as the insulating material.

The second redistribution layer 152 may serve to redistribute the second connection pads 122b to other regions. The second redistribution layer 152 may be disposed on the second encapsulant 150 and the active surface of the second semiconductor chip 122. A material of the second redistribution layer 152 may be a conductive material such as copper (Cu), aluminum (Al), silver (Ag), tin (Sn), gold (Au), nickel (Ni), lead (Pb), titanium (Ti), or alloys thereof. The second redistribution layer 152 may perform various functions depending on a design of the corresponding layer. For example, the second redistribution layer 152 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the second redistribution layer 152 may include various pad patterns such as via pads, connection terminal pads, and the like.

The second vias 153 may electrically connect the second redistribution layers 152, the second connection pads 122b, and the like, formed on different layers to each other, resulting in an electrical path. The second vias 153 may penetrate through the second encapsulant 150, and may be in contact with the second connection pads 122b. A material of each of the second vias 153 may be a conductive material such as copper (Cu), aluminum (Al), silver (Ag), tin (Sn), gold (Au), nickel (Ni), lead (Pb), titanium (Ti), or alloys thereof. Each of the second vias 153 may be completely filled with the conductive material, or the conductive material may also be formed along a wall of each of via holes. The second via 153 may have a reverse tapered shape of which a lower diameter is greater than an upper diameter, and it may be advantageous in a process that the second via 153 has such a form.

The third vias 155 may electrically connect the first and second redistribution layers 142 and 152 formed on different layers to each other, resulting in an electrical path. The third vias 155 may penetrate through the second encapsulant 150, and may also penetrate through the second insulating layer 141b of the connection member 140. A material of each of the third vias 155 may be a conductive material such as copper (Cu), aluminum (Al), silver (Ag), tin (Sn), gold (Au), nickel (Ni), lead (Pb), titanium (Ti), or alloys thereof. Each of the third vias 155 may be completely filled with the conductive material, or the conductive material may also be formed along a wall of each of via holes. When the third vias 155 are formed at a predetermined thickness along the walls of the via holes penetrating through the second encapsulant 150, spaces between the third vias 155 of the via holes may be filled with the passivation layer 160. The third via 155 may have a tapered shape of which a lower diameter is greater than an upper diameter, and it may be advantageous in a process that the third via 155 has such a form. That is, when the third via 155 is formed in a surface perpendicular to a first active surface, a cut surface of the third via 155 may have a taper shape. A diameter of the third via 155 may be greater than that of the second via 153. In addition, a height of the third via 155 may be greater than that of the second via 153. That is, the vias 153 and 155 may have a form of a multi-stage vias in which signals, or the like, may be stably transmitted.

The passivation layer 160 may protect the second redistribution layer 152, and the like, from external physical or chemical damage, or the like. The passivation layer 160 may have the openings exposing at least portions of the second redistribution layer 152. The number of openings formed in the passivation layer 160 may be several tens to several thousands. A material of the passivation layer 160 is not particularly limited, but may be a photosensitive insulating material such as a PID resin. Alternatively, a solder resist may also be used as the material of the passivation layer 160. Alternatively, an insulating resin that does not include a core material, but includes a filler, for example, ABF including an inorganic filler and an epoxy resin may be used as the material of the passivation layer 160.

The underbump metal layer 170 may improve connection reliability of the connection terminals 180 and improve board level reliability of the fan-out semiconductor package 100A. The underbump metal layer 170 may be connected to the second redistribution layer 152 opened through the openings of the passivation layer 160. The underbump metal layer 170 may be formed in the openings of the passivation layer 160 by the known metallization method using the known conductive material such as a metal, but is not limited thereto.

The connection terminals 180 may be additionally configured to physically or electrically externally connect the fan-out semiconductor package 100A. For example, the fan-out semiconductor package 100A may be mounted on the main board of the electronic device through the connection terminals 180. Each of the connection terminals 180 may be formed of a conductive material, for example, a solder, or the like. However, this is only an example, and a material of each of the connection terminals 180 is not particularly limited thereto. Each of the connection terminals 180 may be a land, a ball, a pin, or the like. The connection terminals 180 may be formed as a multilayer or single layer structure. When the connection terminals 180 are formed as a multilayer structure, the connection terminals 180 may include a copper (Cu) pillar and a solder. When the connection terminals 180 are formed as a single layer structure, the connection terminals 180 may include a tin-silver solder or copper (Cu). However, this is only an example, and the connection terminals 180 are not limited thereto.

The number, an interval, a disposition, or the like, of the connection terminals 180 is not particularly limited, and may be sufficiently modified by a person skilled in the art depending on design particulars. For example, the connection terminals 180 may be provided in an amount of several tens to several thousands or may be provided in an amount of several tens to several thousands or more or several tens to several thousands or less. When the connection terminals 180 are solder balls, the connection terminals 180 may cover side surfaces of the underbump metal layer 170 extending onto one surface of the passivation layer 160, and connection reliability may be more excellent.

At least one of the connection terminals 180 may be disposed in a fan-out region. The fan-out region is a region except for a region in which the first and second semiconductor chips 121 and 122 are disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Meanwhile, although not illustrated in the drawings, a metal layer may be further disposed on the wall of the through-hole 110H, if necessary. The metal layer may serve to effectively dissipate heat generated from the first semiconductor chip 121. In addition, the metal layer may also serve to block electromagnetic waves. In addition, a separate passive component such as a capacitor, an inductor, or the like, in addition to the first semiconductor chip 121, may be further disposed in the through-hole 110H. In addition to the structures described above, the structures known in the related art may be applied.

FIGS. 11A through 11D are schematic views illustrating an example of processes of manufacturing the fan-out semiconductor package of FIG. 9.

Figure 11A:
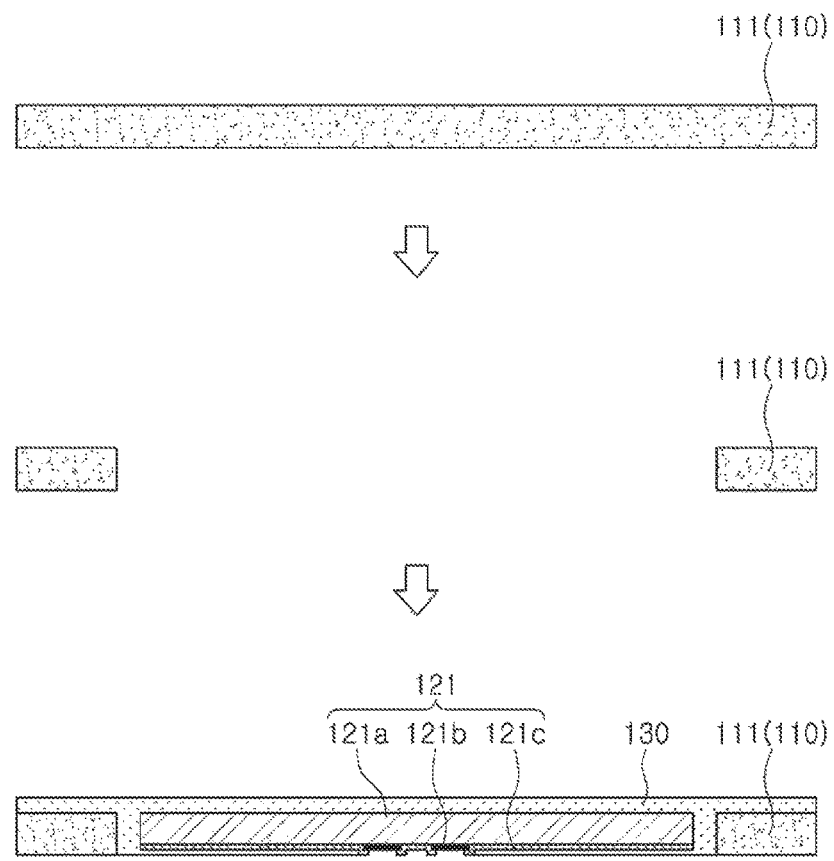
FIGS. 11A through 11D are schematic views illustrating an example of processes of manufacturing the fan-out semiconductor package of FIG. 9.

Referring to FIG. 11A, the support member 110 may be first prepared. The support member 110 may be formed of an insulating layer 111. The insulating layer 111 may be an unclad copper clad laminate (CCL), or the like, but is not limited thereto. Then, the through-hole 110H may be formed in the support member 110. The through-hole 110H may be formed using a mechanical drill, a laser drill, or the like, but is not limited thereto. After the through-hole 110H is formed, a desmear process, or the like, may be additionally performed. Then, the first semiconductor chip 121 may be disposed in a face-down form in the through-hole 110H of the support member 110, and may be encapsulated with the first encapsulant 130. An adhesive film (not illustrated), or the like, may be used to dispose the first semiconductor chip 121. For example, a method of attaching the adhesive film (not illustrated) to the support member 110, attaching the first semiconductor chip 121 to the adhesive film (not illustrated) exposed through the through-hole 110H, forming the first encapsulant 130 by the known lamination method or applying method, and then removing the adhesive film (not illustrated) may be used.

Figure 11B:
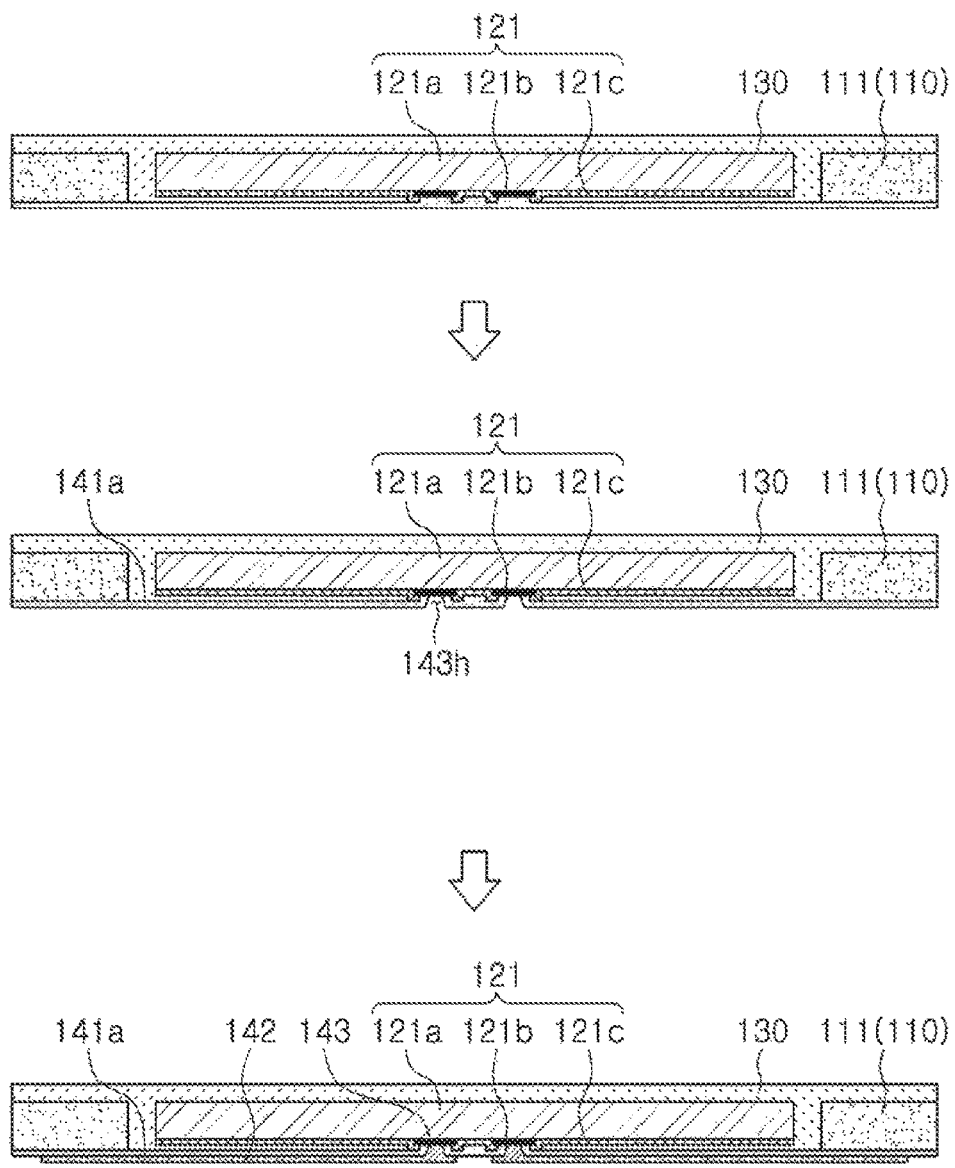

Referring to FIG. 11B, then, the first insulating layer 141a may be formed on the support member 110 and the active surface of the first semiconductor chip 121. The first insulating layer 141a may also be formed by a method of laminating or applying a PID, or the like. Then, via holes 143h penetrating through the first insulating layer 141a may be formed. The via holes 143h may be formed by a photolithography method such as exposure, development, and the like. Next, the first redistribution layer 142 and the first vias 143 may be formed. The first redistribution layer 142 and the first via 143 may be formed by a method of forming patterns using a dry film, or the like, and then filling the patterns by a plating process. The plating process may be a subtractive process, an additive process, a semi-additive process (SAP), a modified semi-additive process (MSAP), or the like, but is not limited thereto.

Figure 11C:
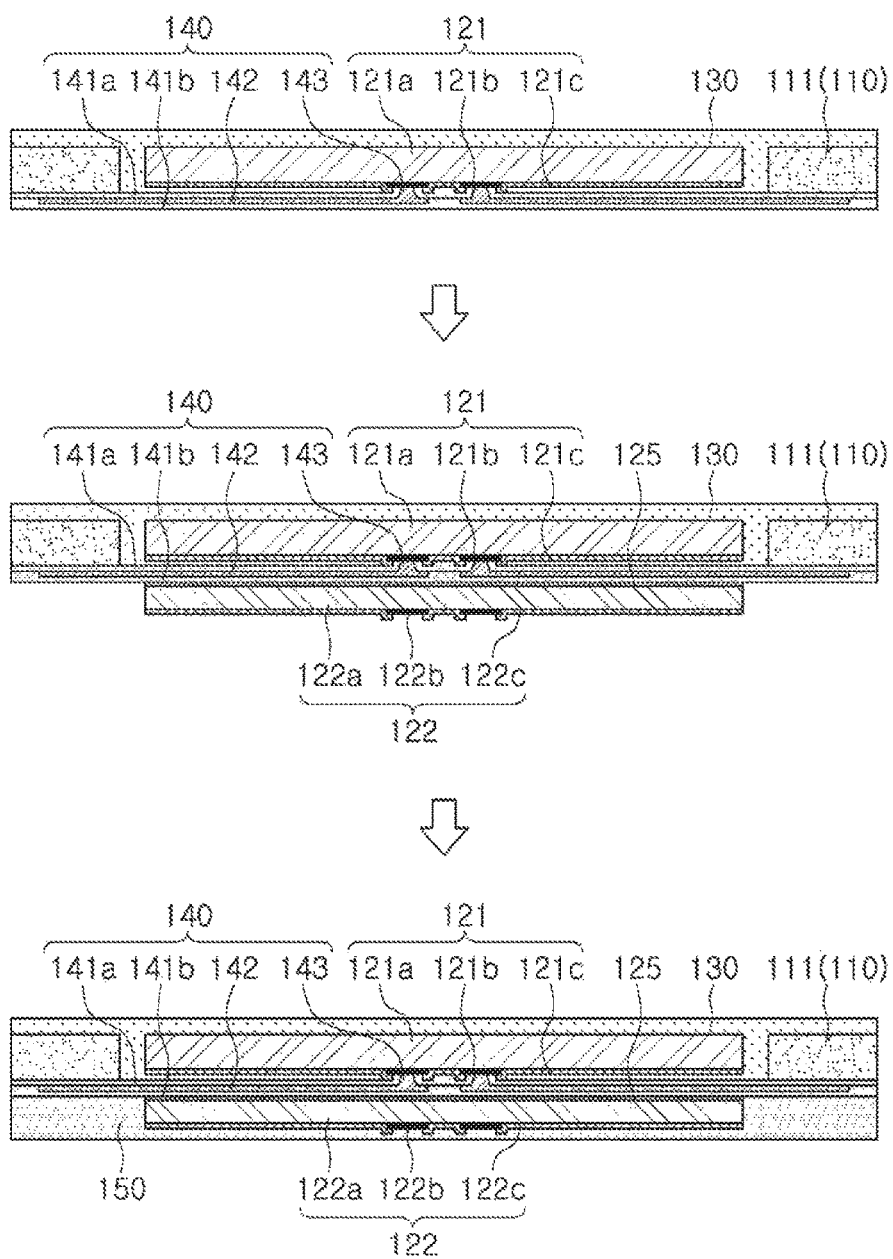

Referring to FIG. 11C, then, the second insulating layer 141b may be formed on the first insulating layer 141a. The second insulating layer 141b may also be formed by a method of laminating or applying a PID, or the like. Resultantly, the connection member 140 may be formed. Then, the second semiconductor chip 122 may be attached to the second insulating layer 141b using the adhesive member 125, or the like. Then, the second encapsulant 150 encapsulating at least portions of the second semiconductor chip 122 may be formed by the known lamination method, applying method, or the like.

Figure 11D:
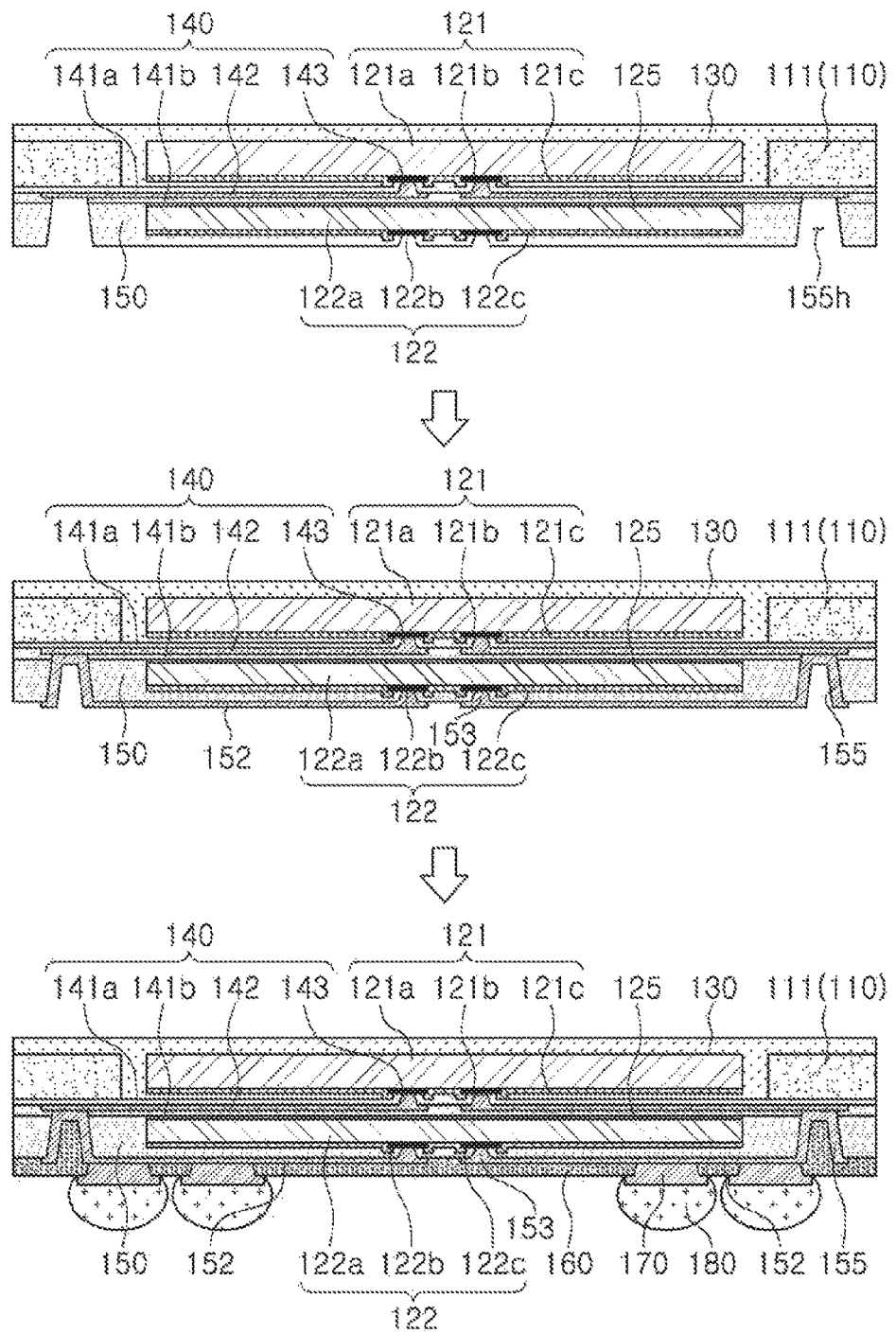

Referring to FIG. 11D, then, via holes 153h penetrating through the second encapsulant 150 may be formed. In addition, via holes 155h penetrating through the second encapsulant 150 and the second insulating layer 141b of the connection member 140 may be formed. The via holes 153h and 155h may be formed by a photolithography method using exposure and development. However, the via holes 153h and 155h may also be formed using a mechanical drill, a laser drill, or the like, depending on a material of the second encapsulant 150. Then, the second redistribution layer 152 and the second and third vias 153 and 155 may be formed. The second redistribution layer 152 and the second and third vias 153 and 155 may be formed by a method of forming patterns using a dry film, or the like, and then filling the patterns by a plating process. The plating process may be a subtractive process, an additive process, a semi-additive process (SAP), a modified semi-additive process (MSAP), or the like, but is not limited thereto. Then, the passivation layer 160, the underbump metal layer 170, and the connection terminals 180 may be sequentially formed. The passivation layer 160 may be formed by the known lamination or hardening method, the underbump metal layer 170 may be formed by the known metallization method, and the connection terminals 180 may be formed by a reflow process, or the like.

Meanwhile, a series of processes may be processes of preparing the support member 110 having a large size, manufacturing a plurality of fan-out semiconductor packages, and then singulating the plurality of fan-out semiconductor packages into individual fan-out semiconductor packages through a sawing process in order to facilitate mass production. In this case, productivity may be excellent.

Figure 12:
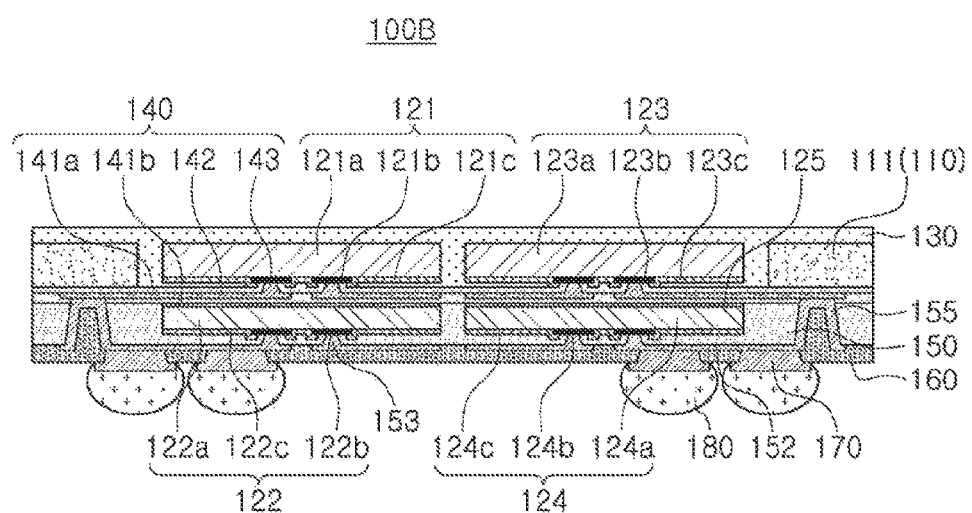
FIG. 12 is a schematic cross-sectional view illustrating another example of a fan-out semiconductor package.

FIG. 12 is a schematic cross-sectional view illustrating another example of a fan-out semiconductor package.

Referring to the drawing, in a fan-out semiconductor package 100B according to another exemplary embodiment in the present disclosure, first and third semiconductor chips 121 and 123 may be disposed side by side in a through-hole 110H of a support member 110. The first and third semiconductor chips 121 and 123 may have first and third connection pads 121b and 123b disposed on active surfaces of bodies 121a and 123a thereof, respectively, and each of the first and third connection pads 121b and 123b may be redistributed by a first redistribution layer 142 of a connection member 140. In addition, second and fourth semiconductor chips 122 and 124 may be attached side by side to the connection member 140 using first and second adhesive members 125a and 125b, and the like, respectively. The second and fourth semiconductor chips 122 and 124 may have second and fourth connection pads 122b and 124b disposed on active surfaces of bodies 122a and 124a thereof, respectively, and each of the second and fourth connection pads 122b and 124b may be redistributed by a second redistribution layer 152 formed on a second encapsulant 150. Passivation layers 123c and 124c, and the like, may be disposed on active surfaces of the third and fourth semiconductor chips 123 and 124, respectively. A description of other configurations and a manufacturing method except for the abovementioned configuration overlaps that described above, and is thus omitted.

Figure 13:
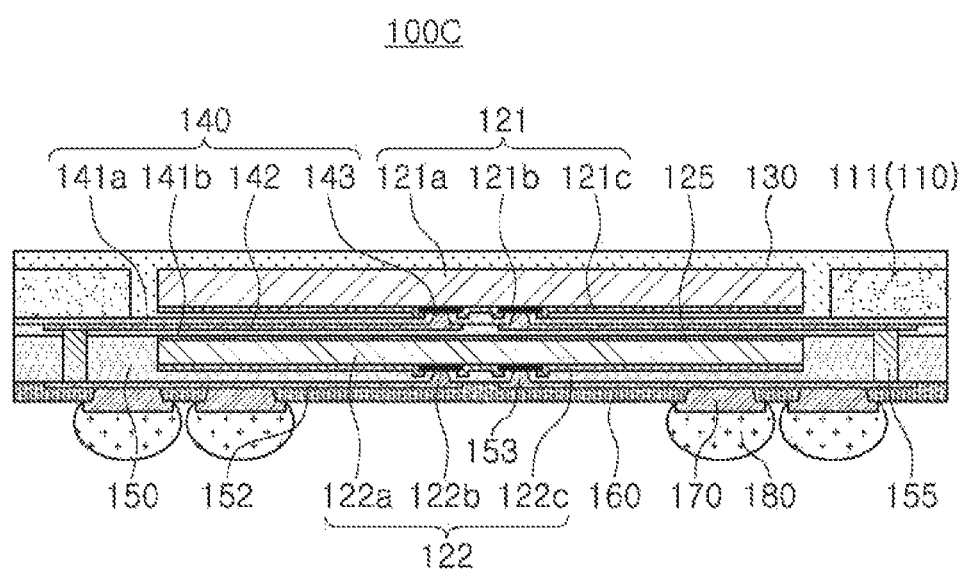
FIG. 13 is a schematic cross-sectional view illustrating another example of a fan-out semiconductor package.

FIG. 13 is a schematic cross-sectional view illustrating another example of a fan-out semiconductor package.

Referring to the drawing, in a fan-out semiconductor package 100C according to another exemplary embodiment in the present disclosure, third vias 155 may have a shape of a metal post. That is, the third vias 155 may also be formed in the shape of the metal post, if necessary. The metal post may be, for example, a copper post, but is not limited thereto. A description of other configurations and a manufacturing method except for the abovementioned configuration overlaps that described above, and is thus omitted. Meanwhile, components of feature parts of the fan-out semiconductor packages 100B and 100C according to another exemplary embodiment in the present disclosure described above may be combined with each other.

Figure 14:
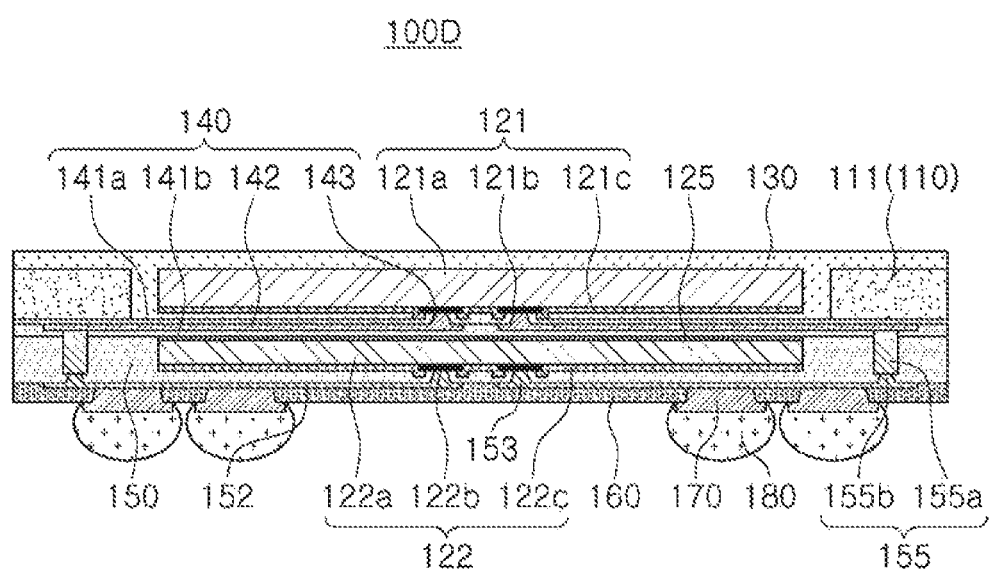
FIG. 14 is a schematic cross-sectional view illustrating another example of a fan-out semiconductor package.

FIG. 14 is a schematic cross-sectional view illustrating another example of a fan-out semiconductor package.

Referring to the drawing, in a fan-out semiconductor package 100D according to another exemplary embodiment in the present disclosure, third vias 155 may include metal posts 155a and via conductors 155b. That is, the third vias 155 may also be formed to include both of the metal posts 155a and the via conductors 155b, if necessary. A description of other configurations and a manufacturing method except for the abovementioned configuration overlaps that described above, and is thus omitted. Meanwhile, components of feature parts of the fan-out semiconductor packages 100B, 100C, and 100D according to another exemplary embodiment in the present disclosure described above may be combined with one another.

Figure 15:
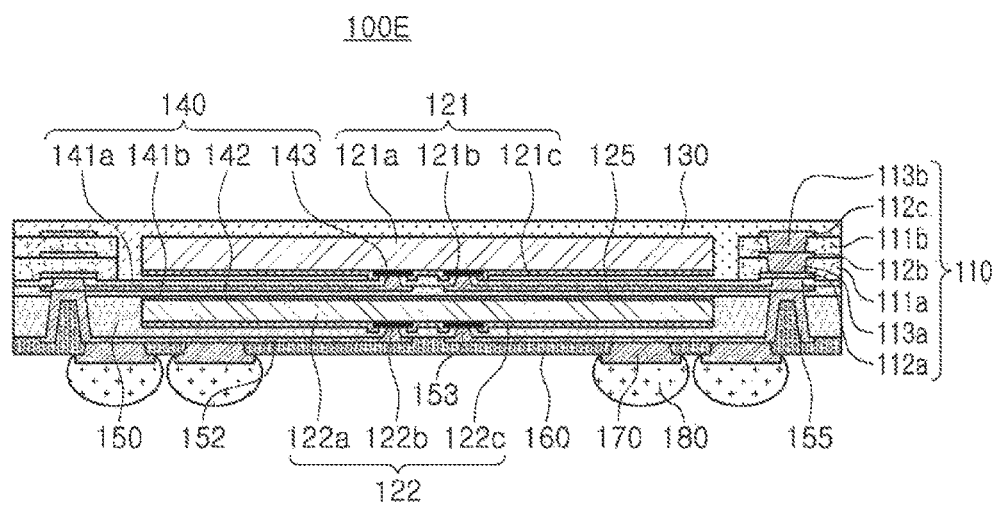
FIG. 15 is a schematic cross-sectional view illustrating another example of a fan-out semiconductor package.

FIG. 15 is a schematic cross-sectional view illustrating another example of a fan-out semiconductor package.

Referring to the drawing, in a fan-out semiconductor package 100E according to another exemplary embodiment in the present disclosure, a support member 110 may include a first insulating layer 111a in contact with a connection member 140, a first redistribution layer 112a in contact with the connection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. Since the support member 110 may include a large number of redistribution layers 112a, 112b, and 112c, the support member 110 may perform some of roles of the connection member 140, such that the connection member 140 may be simplified. Therefore, a decrease in a yield depending on a defect occurring in a process of forming the connection member 140 may be suppressed. Since the first redistribution layer 112a is embedded in the first insulating layer 111a, an insulating distance of an insulating layer 141a of the connection member 140 may be relatively constant. The first redistribution layer 112a may be recessed into the first insulating layer 111a, such that a lower surface of the first insulating layer 111a may have a step with respect to a lower surface of the first redistribution layer 112a. Resultantly, a phenomenon in which a first encapsulant 130 bleeds into the first redistribution layer 112a may be prevented. The first to third redistribution layers 112a, 112b, and 112c may be electrically connected to each other through first and second vias 113a and 113b penetrating through the first and second insulating layers 111a and 111b.

The lower surface of the first redistribution layer 112a of the support member 110 may be disposed on a level above a lower surface of a first connection pad 121b of a first semiconductor chip 121. In addition, a distance between a first redistribution layer 142 of the connection member 140 and the first redistribution layer 112a of the support member 110 may be greater than that between the first redistribution layer 142 of the connection member 140 and the first connection pad 121b of the first semiconductor chip 121. Here, the first redistribution layer 112a may be recessed into the first insulating layer 111a. The second redistribution layer 112b of the support member 110 may be disposed on a level between an active surface and an inactive surface of the first semiconductor chip 121. The support member 110 may be formed at a thickness corresponding to that of the first semiconductor chip 121. Therefore, the second redistribution layer 112b formed in the support member 110 may be disposed on the level between the active surface and the inactive surface of the first semiconductor chip 121.

Thicknesses of the redistribution layers 112a, 112b, and 112c of the support member 110 may be greater than that of the first redistribution layer 142 of the connection member 140. Since the support member 110 may have a thickness equal to or greater than that of the first semiconductor chip 121, the redistribution layers 112a, 112b, and 112c may be formed at large sizes depending on a scale of the support member 110. On the other hand, the first redistribution layer 142 of the connection member 140 may be formed at a relatively small size for thinness.

The support member 110 may be prepared by, for example, preparing a carrier film having a metal layer formed on one surface or opposite surfaces thereof, forming the first redistribution layer 112a using the metal layer as a seed layer, forming the first insulating layer 111a covering the first redistribution layer 112a on the metal layer, forming the second redistribution layer 112b on the first insulating layer 111a, forming the second insulating layer 111b covering the second redistribution layer 112b on the first insulating layer 111a, forming the third redistribution layer 112c on the second insulating layer 111b to form the support member 110, separating the support member 110 from the carrier film, and then removing the metal layer remaining on the first redistribution layer 112a. When the metal layer is removed, a recess portion may be formed in the support member 110. The redistribution layers 112a, 112b, and 112c may be formed by performing patterning using a dry film, or the like, and filling patterns by the known plating process. The insulating layers 111a and 111b may be formed by the known lamination method or applying and hardening method. Meanwhile, when the second and third redistribution layers 112b and 112c are formed after via holes are formed in the first and second insulating layers 111a and 111b, the first and second vias 113a and 113b may also be formed by plating.

A description of other configurations and a manufacturing method except for the abovementioned configuration overlaps that described above, and is thus omitted. Meanwhile, components of feature parts of the fan-out semiconductor packages 100B, 100C, 100D, and 100E according to another exemplary embodiment in the present disclosure described above may be combined with one another.

Figure 16:
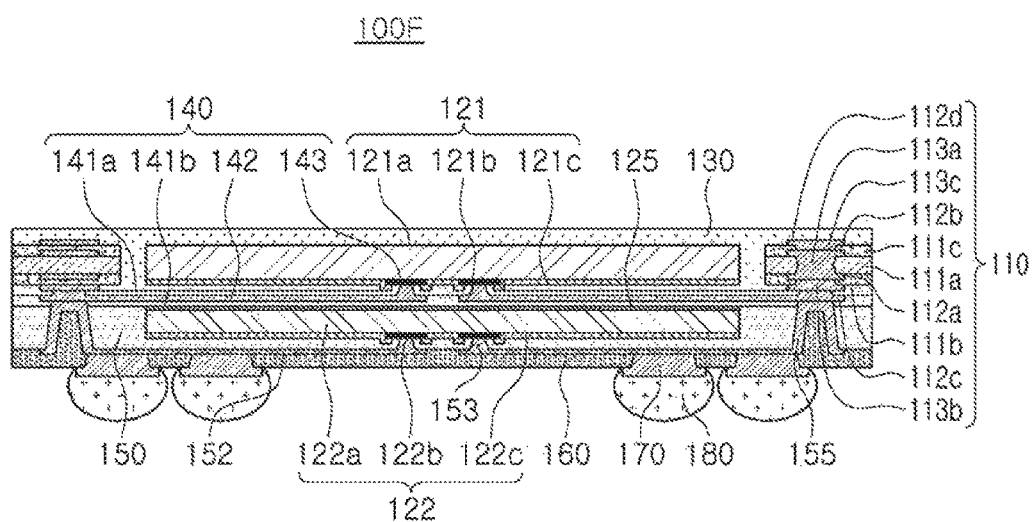
FIG. 16 is a schematic cross-sectional view illustrating another example of a fan-out semiconductor package.

FIG. 16 is a schematic cross-sectional view illustrating another example of a fan-out semiconductor package.

Referring to the drawing, in a fan-out semiconductor package 100F according to another exemplary embodiment in the present disclosure, a support member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. Since the support member 110 may include a large number of redistribution layers 112a, 112b, 112c, and 112d, a connection member 140 may be further simplified. The first to fourth redistribution layers 112a, 112b, 112c, and 112d may be electrically connected to each other through first to third vias 113a, 113b, and 113c each penetrating through the first to third insulating layers 111a, 111b, and 111c.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto. Similarly, the first via 113a may have a diameter greater than those of the second via 113b and the third via 113c.

Thicknesses of the redistribution layers 112a, 112b, 112c, and 112d of the support member 110 may be greater than that of a first redistribution layer 142 of the connection member 140. Since the support member 110 may have a thickness equal to or greater than that of the first semiconductor chip 121, the redistribution layers 112a, 112b, 112c, and 112d may also be formed to have large sizes. On the other hand, the first redistribution layer 142 of the connection member 140 may be formed at a relatively smaller size for thinness.

The support member 110 may be prepared by, for example, preparing a copper clad laminate (CCL) as the first insulating layer 111a, forming the first and second redistribution layers 112a and 112b on opposite surfaces of the first insulating layer 111a, respectively, using copper layers of the copper clad laminate as seed layers, stacking ABFs, or the like, as the second and third insulating layers 111b and 111c on opposite surfaces of the first insulating layer 111a, respectively, and then forming the third and fourth redistribution layers 112c and 112d on the second and third insulating layers 111b and 111c, respectively. The redistribution layers 112a, 112b, 112c, and 112d may be formed by performing patterning using a dry film, or the like, and filling patterns by the known plating process. The insulating layers 111b and 111c may be formed by the known lamination method or applying and hardening method. Meanwhile, when the first to fourth redistribution layers 112a, 112b, 112c, and 112d are formed after via holes are formed in the first to third insulating layers 111a, 111b, and 111c, the first to third vias 113a, 113b, and 113c may also be formed by plating.

A description of other configurations and a manufacturing method except for the abovementioned configuration overlaps that described above, and is thus omitted. Meanwhile, components of feature parts of the fan-out semiconductor packages 100B, 100C, 100D, and 100F according to another exemplary embodiment in the present disclosure described above may be combined with one another.

As set forth above, according to the exemplary embodiments in the present disclosure, a fan-out semiconductor package capable of being thinned and having improved performance and excellent reliability in spite of using a plurality of semiconductor chips may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
    a first semiconductor chip having a first active surface having first connection pads disposed thereon and a first inactive surface opposing the first active surface;
    a first encapsulant encapsulating at least portions of the first semiconductor chip;
    a connection member disposed on the first encapsulant and the first active surface of the first semiconductor chip and including first vias and a first redistribution layer electrically connected to the first connection pads through the first vias;
    a second semiconductor chip having a second active surface having second connection pads disposed thereon, and a second inactive surface opposing the second active surface and attached to the connection member;
    a second encapsulant covering at least portions of the connection member and encapsulating at least portions of the second semiconductor chip;
    a second redistribution layer disposed on the second encapsulant and the second active surface of the second semiconductor chip;
    second vias penetrating through the second encapsulant and electrically connecting the second connection pads and the second redistribution layer to each other; and
    third vias penetrating through the second encapsulant and electrically connecting the first redistribution layer and the second redistribution layer to each other.

2. The semiconductor package of claim 1, wherein a first region is a projected region of the first semiconductor chip projected in a direction perpendicular to the first active surface and a second region is a region surrounding the first region, and all the first connection pads connected to the first vias are redistributed to the second region through the first redistribution layer.

3. The semiconductor package of claim 1, wherein a cut surface of the third via by a plane perpendicular to the first active surface has a taper shape.

4. The semiconductor package of claim 1, wherein the first connection pads are arrayed on a central portion of the first active surface of the first semiconductor chip.

5. The semiconductor package of claim 1, wherein the first connection pads are in direct contact with the first vias of the connection member.

6. The semiconductor package of claim 1, further comprising a passivation layer disposed on the second encapsulant and the second active surface of the second semiconductor chip and covering at least portions of the second redistribution layer,
    wherein the passivation layer includes openings opening portions of the second redistribution layer, and
    at least one of the openings of the passivation layer is disposed on a fan-out region of the second semiconductor chip.

7. The semiconductor package of claim 6, wherein the third vias are formed at a predetermined thickness along walls of via holes penetrating through the second encapsulant, and
    the passivation layer fills spaces between the third vias of the via holes.

8. The semiconductor package of claim 1, further comprising a die attach film (DAF), through which the second inactive surface of the second semiconductor chip is attached to the connection member.

9. The semiconductor package of claim 1, wherein the connection member includes a first insulating layer disposed on the first encapsulant and the first active surface of the first semiconductor chip, the first redistribution layer disposed on the first insulating layer, the first vias penetrating through the first insulating layer and electrically connecting the first connection pads and the first redistribution layer to each other, and a second insulating layer disposed on the first insulating layer and covering at least portions of the first redistribution layer, and
    the second inactive surface of the second semiconductor chip is attached to the second insulating layer.

10. The semiconductor package of claim 1, further comprising a support member having a through-hole and disposed on one surface of the connection member on which the first semiconductor chip is disposed,
    wherein the first semiconductor chip is disposed in the through-hole, and
    the first encapsulant fills at least portions of the through-hole.

11. The semiconductor package of claim 10, wherein the support member includes a third redistribution layer electrically connected to the first redistribution layer.

12. The semiconductor package of claim 10, wherein the support member includes a first insulating layer, a third redistribution layer in contact with the connection member and embedded in the first insulating layer, and a fourth redistribution layer disposed on the other surface of the first insulating layer opposing one surface of the first insulating layer in which the third redistribution layer is embedded.

13. The semiconductor package of claim 12, wherein the support member further includes a second insulating layer disposed on the first insulating layer and covering the fourth redistribution layer and a fifth redistribution layer disposed on the second insulating layer.

14. The semiconductor package of claim 10, wherein the support member includes a first insulating layer, a third redistribution layer and a fourth redistribution layer disposed on opposite surfaces of the first insulating layer, respectively, a second insulating layer disposed on the first insulating layer and covering the third redistribution layer, and a fifth redistribution layer disposed on the second insulating layer.

15. The semiconductor package of claim 14, wherein the support member further includes a third insulating layer disposed on the first insulating layer and covering the fourth redistribution layer and a sixth redistribution layer disposed on the third insulating layer.

16. The semiconductor package of claim 1, wherein a length of the longest side of a first cut surface of the second via is less than that of the longest side of a second cut surface of the third via, the first cut surface being a surface of the second via cut by a plane parallel to the second active surface, and the second cut surface being a surface of the third via cut by the plane parallel to the second active surface.

17. The semiconductor package of claim 1, wherein the third vias have a diameter greater than those of the first vias and the second vias.

18. A semiconductor package comprising:
- a first semiconductor chip having a first active surface having first connection pads disposed thereon and a first inactive surface opposing the first active surface;
- a first encapsulant encapsulating at least portions of the first semiconductor chip;
- a second semiconductor chip having a second active surface having second connection pads disposed thereon, and a second inactive surface opposing the second active surface;
- a connection member disposed between the first encapsulant and the first active surface of the first semiconductor chip, and the second encapsulant and the second inactive surface of the second semiconductor chip, the connection member including a first insulating layer, first vias penetrating through the first insulating layer and being in contact with the first connection pads of the first semiconductor chip, and a first redistribution layer electrically connected to the first connection pads through the first vias;
- a second encapsulant covering at least portions of the connection member and encapsulating at least portions of the second semiconductor chip;
- a second redistribution layer disposed on the second encapsulant and the second active surface of the second semiconductor chip;
- second vias penetrating through the second encapsulant and electrically connecting the second connection pads and the second redistribution layer to each other; and
- third vias penetrating through the second encapsulant and electrically connecting the first redistribution layer and the second redistribution layer to each other.

19. The semiconductor package of claim 18, wherein the connection member further includes a second insulating layer disposed on the first redistribution layer,
the first insulating layer of the connection member is in contact with the first encapsulant, and
the second insulating layer of the connection member is in contact with the second encapsulant.

20. The semiconductor package of claim 18, wherein the third vias have a diameter greater than those of the first vias and the second vias.

* * * * *